(12) United States Patent
Rallabandi et al.

(10) Patent No.: US 7,545,214 B2
(45) Date of Patent: Jun. 9, 2009

(54) CLASS AB RAIL-TO-RAIL INPUT AND OUTPUT OPERATIONAL AMPLIFIER

(75) Inventors: Madan G. Rallabandi, Tucson, AZ (US); Scott C. McLeod, Oro Valley, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 88 days.

(21) Appl. No.: 11/742,516

(22) Filed: Apr. 30, 2007

(65) Prior Publication Data

US 2008/0265993 A1 Oct. 30, 2008

(51) Int. Cl.
*H03F 3/45* (2006.01)

(52) U.S. Cl. .................................... 330/255; 330/257

(58) Field of Classification Search ................ 330/255
See application file for complete search history.

(56) References Cited

U.S. PATENT DOCUMENTS

| | | | |
|---|---|---|---|
| 4,766,394 A * | 8/1988 | Yukawa | 330/253 |
| 5,371,474 A | 12/1994 | Wassenaar et al. | |
| 5,568,093 A | 10/1996 | Holzer | |
| 5,631,607 A | 5/1997 | Huijsing et al. | |
| 5,909,146 A | 6/1999 | Okada | |
| 5,917,378 A | 6/1999 | Juang | |
| 6,384,679 B1 | 5/2002 | Lorenz | |
| 6,542,032 B2 | 4/2003 | Escobar-Bowser et al. | |
| 6,545,538 B1 | 4/2003 | Ivanov et al. | |
| 6,879,213 B2 | 4/2005 | Darzy | |
| 7,064,609 B1 | 6/2006 | Beck et al. | |
| 7,102,335 B1 | 9/2006 | Solie | |
| 7,102,436 B2 * | 9/2006 | Sung | 330/255 |
| 7,187,235 B2 | 3/2007 | Moon | |
| 7,339,430 B2 | 3/2008 | Chiu | |
| 7,368,984 B2 | 5/2008 | Kirn | |
| 7,375,585 B2 * | 5/2008 | Trifonov et al. | 330/258 |
| 2008/0024217 A1 | 1/2008 | Chiu | |

OTHER PUBLICATIONS

Op 'T Eynde, et al.; "Analog interfaces for digital signal processing systems—Chapter 2—A Design Example: A CMOS Low-Distortion Class AB Power Amplifier"; Springer International Series in Engineering and Computer Science; Springer, 1st Edition; Jun. 1993; pp. 62-63.

* cited by examiner

*Primary Examiner*—Steven J Mottola
(74) *Attorney, Agent, or Firm*—Meyertons Hood Kivlin Kowert & Goetzel, P.C.; Jeffrey C. Hood (57) ABSTRACT

An operational amplifier including an input stage. The input stage may include first and second differential input circuits and a first current mirror. When an input terminal of the operational amplifier is at a positive voltage rail, the first differential input circuit may be activated. When the input terminal is at a negative voltage rail, the second differential input circuit may be activated. In either case, this may cause the first current mirror to provide a current of a predetermined value to each of first and second input terminals of a control circuit, and to each of first and second nodes coupled to a rail-to-rail output stage. The input stage may maintain the current provided to each of the input terminals of the control circuit and to each of the nodes coupled to the rail-to-rail output stage constant over the full input voltage range from the negative voltage rail to the positive voltage rail.

23 Claims, 4 Drawing Sheets

CLASS AB RAIL-TO-RAIL INPUT AND OUTPUT OPERATIONAL AMPLIFIER

BACKGROUND OF THE INVENTION

1. Field of the Invention

This invention relates to analog circuits and, more particularly, to operational amplifiers.

2. Description of the Related Art

One of the most widely used electronic devices in the electronics industry is the operational amplifier, or 'op-amp'. Operational amplifiers are very efficient and versatile devices that are used in various applications to meet design requirements for signal conditioning, special transfer functions, analog instrumentation, and analog computation, among others.

For analog design, operational amplifiers are classified as either class A, class B, class AB, or class C. Class A amplifiers typically have low distortion, but they have poor efficiency. Class B and class C amplifiers have excellent efficiency, but they create a large amount of distortion. Class AB amplifiers, which are generally designed to have two output transistors in a push-pull arrangement, achieve a compromise between efficiency and distortion.

One technique for designing class AB operations amplifiers is to use translinear loops to control the current in the output stage of the amplifier. This solution is generally not very accurate and also requires extra circuitry, which makes it rather complex to design. Another drawback with the above-mentioned method is the stability of the amplifier. The added circuitry usually introduces more poles and hence de-stabilizes the circuit.

SUMMARY OF THE INVENTION

Various embodiments are disclosed of an operational amplifier including an input stage. The input stage of the operational amplifier may be coupled to an input terminal of the operational amplifier. Furthermore, the input stage may be coupled to a control circuit and to a rail-to-rail output stage of the operational amplifier. The input stage may include a first differential input circuit, a first current mirror, and a second differential input circuit.

During operation, when the input terminal is at a positive voltage rail of the operational amplifier, the first differential input circuit may be activated and the second differential input circuit may be deactivated. In response to activating the first differential input circuit, the first current mirror may provide a current of a predetermined value to each of a first input terminal and a second input terminal of the control circuit, and to each of a first node and a second node coupled to the rail-to-rail output stage of the operational amplifier.

Furthermore, when the input terminal is at a negative voltage rail of the operational amplifier, the second differential input circuit may be activated and the first differential input circuit may be deactivated. In response to activating the second differential input circuit, the first current mirror may also provide a current of the predetermined value to each of the first and second input terminals of the control circuit, and to each of the first and second nodes coupled to the rail-to-rail output stage of the operational amplifier.

In various embodiments, the input stage may maintain the current provided to each of the first and second input terminals of the control circuit and to each of the first and second nodes coupled to the rail-to-rail output stage constant over the full input voltage range from the negative voltage rail to the positive voltage rail.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Figure 1:
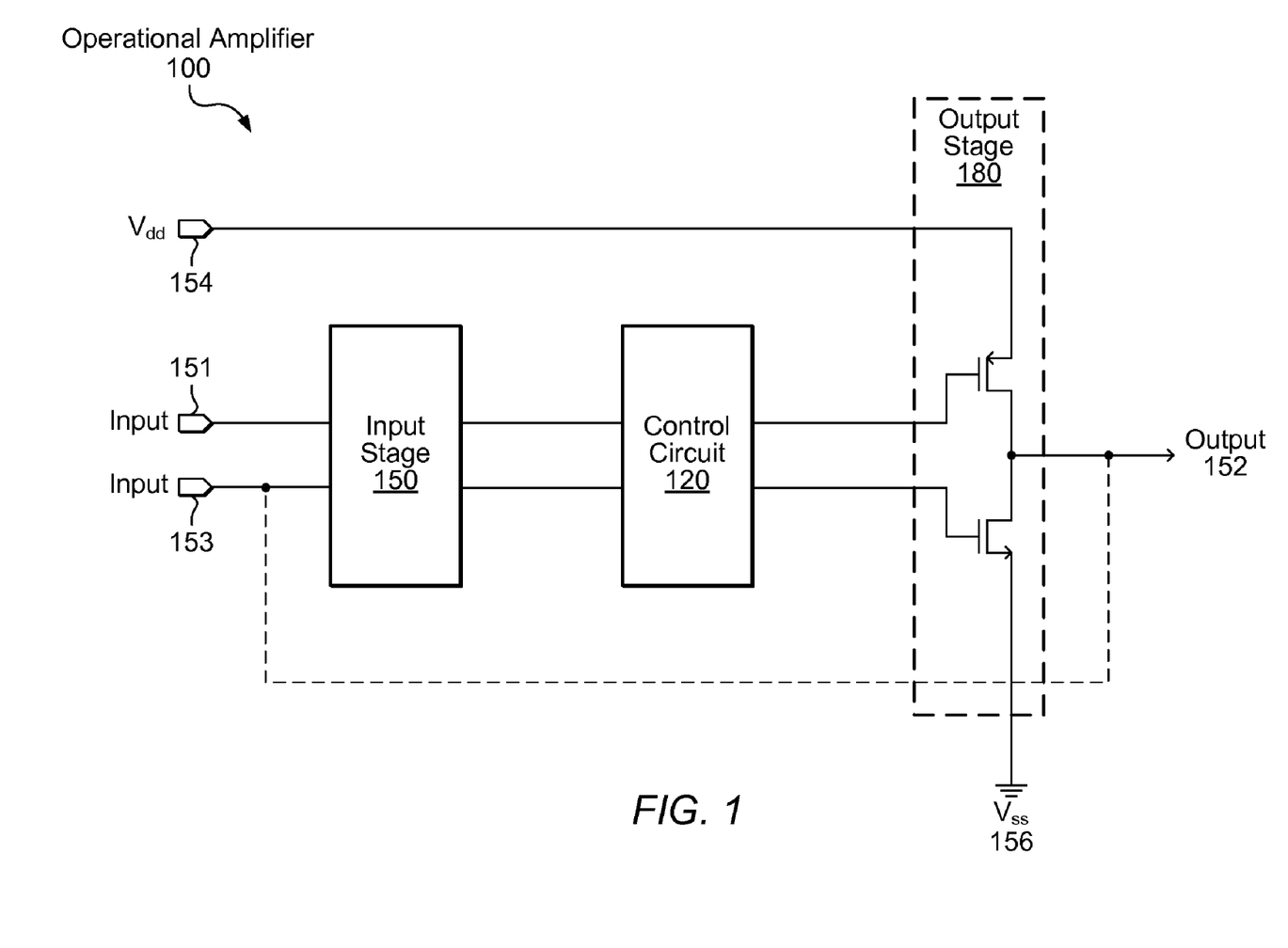
FIG. 1 is a block diagram of one embodiment of an operational amplifier.

FIG. 1 is a block diagram of one embodiment of an operational amplifier 100. Operational amplifier 100 includes an input stage 150, a control circuit 120, a rail-to-rail output stage 180, an input terminal 151, an output terminal 152, an input terminal 153, a positive voltage rail (Vdd) 154, and a negative voltage rail (Vss) 156, e.g., ground.

Operational amplifier 100 may be designed as a class AB operational amplifier that can go rail to rail at its input and output while sourcing and sinking current at the output. As will be described further below, this design compares the gate voltages of the two output devices with a reference voltage and controls the current through the output devices. Also, the amplifier 100 switches current in such a way that the voltage at the output of the amplifier remains constant.

Figure 2A:
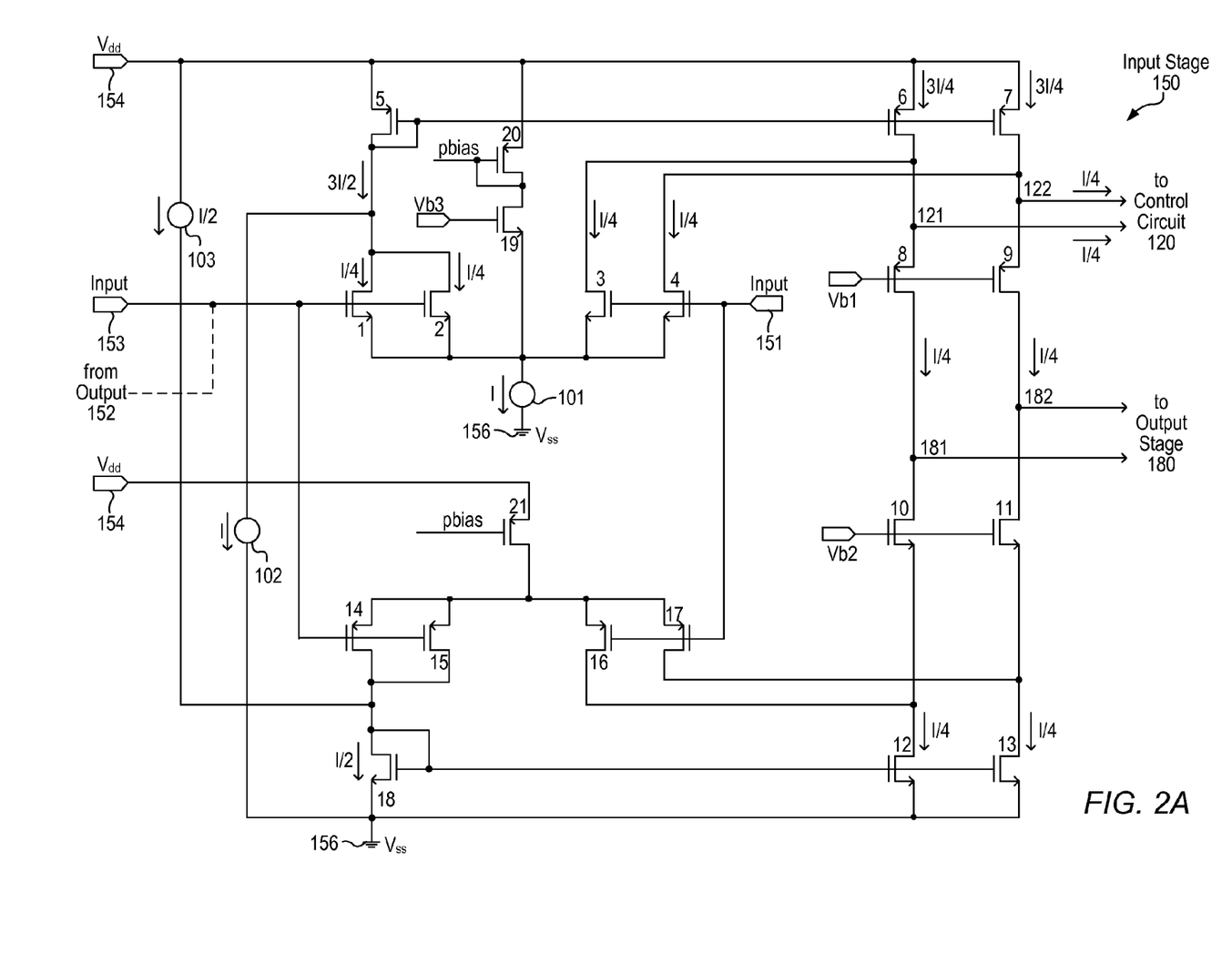
FIG. 2A is a circuit diagram of one embodiment of an input stage of the operational amplifier of FIG. 1.

FIG. 2A is a circuit diagram of one embodiment of the input stage 150 of operational amplifier 100. The input stage 150 may be configured to connect to the control circuit 120 and to the rail-to-rail output stage 180 of the operational amplifier 100. In one specific implementation, the input stage 150 includes a first differential input circuit, a first current mirror, a folded cascode circuit, a second differential input circuit, a second current mirror, a first current source 101, a second current source 102, and a third current source 103.

As illustrated, the first differential input circuit is connected to the input terminal 151 of the operational amplifier 100 and includes an NMOS transistor 1, an NMOS transistor 2, an NMOS transistor 3, and an NMOS transistor 4. In one specific implementation, the gate terminal of NMOS transistors 1 and 2 are coupled to output terminal 152 of operational amplifier 100 (e.g., via the feedback path connected to input terminal 153, shown in FIGS. 1 and 2A), the drain terminal of NMOS transistor 1 is coupled to the drain terminal of NMOS transistor 2, the source terminal of NMOS transistor 1 is coupled to the source terminal of NMOS transistors 2-4, and the gate terminal of NMOS transistors 3 and 4 are coupled to input terminal 151.

The first current mirror is connected to the first differential input circuit and includes a PMOS transistor 5, a PMOS transistor 6, and a PMOS transistor 7. In one specific implementation, the drain terminal of PMOS transistor 5 is coupled to the gate terminal of PMOS transistor 5 and to the drain terminal of NMOS transistors 1 and 2, the gate terminal of PMOS transistor 5 is coupled to the gate terminal of PMOS transistors 6 and 7, and the source terminal of PMOS transistors 5-7 are coupled to positive voltage rail 154 of operational amplifier 100. Furthermore, the drain terminal of PMOS transistor 6 is coupled to the drain terminal of NMOS transistor 3 and to a first input terminal 121 of control circuit 120, and the drain terminal of PMOS transistor 7 is coupled to the drain terminal of NMOS transistor 4 and to a second input terminal 122 of control circuit 120.

In addition, as illustrated in FIG. 2A, the second differential input circuit is coupled to input terminal 151 and to output terminal 152. First current source 101 is coupled between negative voltage rail (Vss) 156 of operational amplifier 100 and the source terminal of NMOS transistors 1, 2, 3, and 4. Also, second current source 102 is coupled between negative voltage rail 156 and the junction of the drain terminal of NMOS transistor 1, the drain terminal of NMOS transistor 2, and the drain terminal of PMOS transistor 5.

During operation, when input terminal 151 is at positive voltage rail 154, the first differential input circuit is activated and the second differential input circuit is deactivated. As will be described further below, in response to activating the first differential input circuit, the first current mirror provides a current of a predetermined value to each of the first input terminal 121 and the second input terminal 122 of control circuit 120, and to each of a first node 181 and a second node 182 coupled to the output stage 180 of the operational amplifier 100.

In various embodiment, when input terminal 151 is at positive voltage rail 154 and the first differential input circuit is activated, first current source 101 provides a current I to the first differential input circuit. In response to receiving the current I, each of NMOS transistors 1 and 2 provide a current I/4 to the first current mirror. Also, second current source 102 provides a current I to the first current mirror. Therefore, the first current mirror receives a total current of 3I/2. In response to receiving the total current 3I/2, the first current mirror provides a current I/4 to each of the first and second input terminals (121, 122) of control circuit 120, and a current I/4 to each of the first and second nodes (181, 182) coupled to output stage 180.

Specifically, as illustrated in the embodiment of FIG. 2A, in response to receiving the total current 3I/2, the first current mirror produces a current 3I/4 through each of PMOS transistors 6 and 7 of the first current mirror. PMOS transistor 6 provides a current I/4 to NMOS transistor 3 of the first differential input circuit, a current I/4 to the first input terminal 121 of control circuit 120, and a current I/4 to the first node 181 coupled to output stage 180. PMOS transistor 7 provides a current I/4 to NMOS transistor 4 of the first differential input circuit, a current I/4 to the second input terminal 122 of control circuit 120, and a current I/4 to the second node 182 coupled to output stage 180.

As described above, in one embodiment, the first current mirror produces a current 3I/4 through each of PMOS transistors 6 and 7 of the first current mirror. However, it is noted that the current produced through each of PMOS transistors 6 and 7 is dependent on the design of the first current mirror. In various embodiments, the ratios associated with the first current mirror may be different and therefore the current produced may vary from one implementation to another. For instance, in some embodiments, instead of a 2 to 1 ratio the first current mirror may have a 3 to 1 ratio. In these embodiments, the first current mirror produces a current I/2 through each of PMOS transistors 6 and 7 of the first current mirror. Similarly, in some embodiments, the current provided by the first and second current sources (101, 102) may vary from one implementation to another.

As illustrated in FIG. 2A, in one specific implementation, the folded cascode circuit is coupled to the first differential input circuit and to the first current mirror. In fact, in this implementation, PMOS transistors 6 and 7 of the first current mirror form part of the folded cascode circuit. A shown, the folded cascode circuit includes PMOS transistors 6, 7, 8, and 9, and NMOS transistors 10, 11, 12, and 13. More specifically, the source terminal of PMOS transistor 8 is coupled to the drain terminal of PMOS transistor 6, the source terminal of PMOS transistor 9 is coupled to the drain terminal of PMOS transistor 7, the drain terminal of PMOS transistor 8 is coupled to the first node 181 coupled to output stage 180 and to the drain terminal of NMOS transistor 10, and the drain terminal of PMOS transistor 9 is coupled to the second node 182 coupled to output stage 180 and to the drain terminal of NMOS transistor 11. Furthermore, the source terminal of NMOS transistor 10 is coupled to the drain terminal of NMOS transistor 12, the source terminal of NMOS transistor 11 is coupled to the drain terminal of NMOS transistor 13, and the source terminal of NMOS transistors 12 and 13 are coupled to negative voltage rail 156, e.g., ground. In one embodiment, during operation, the gate terminal of PMOS transistors 8 and 9, and NMOS transistors 10 and 11 may receive bias voltages Vb1 and Vb2, respectively.

The second differential input circuit is coupled to the input terminal 151 and to the folded cascode circuit. In one specific implementation, the second differential input circuit includes PMOS transistors 14, 15, 16, and 17. As shown in FIG. 2A, in this implementation, the gate terminal of PMOS transistors 14 and 15 are coupled to output terminal 152 of operational amplifier 100 (e.g., via the feedback path shown in FIGS. 1 and 2A), the drain terminal of PMOS transistor 14 is coupled to the drain terminal of PMOS transistor 15, and the source terminal of PMOS transistor 14 is coupled to the source terminal of PMOS transistors 15-17. Furthermore, the gate terminal of PMOS transistors 16 and 17 are coupled to input terminal 151, the drain terminal of PMOS transistor 16 is coupled to the drain terminal of NMOS transistor 12 and to the source terminal of NMOS transistor 10, and the drain terminal of PMOS transistor 17 is coupled to the drain terminal of NMOS transistor 13 and to the source terminal of NMOS transistor 11.

The second current mirror is coupled to the second differential circuit and to the folded cascode circuit. As illustrated in FIG. 2A, in one specific implementation, the second current mirror includes NMOS transistor 12, NMOS transistor 13, and NMOS transistor 18. In fact, in this specific implementation, NMOS transistors 12 and 13 of the second current mirror form part of the folded cascode circuit. In addition, the drain terminal of NMOS transistor 18 is coupled to the gate terminal of NMOS transistor 18 and to the drain terminal of PMOS transistors 14 and 15, the gate terminal of NMOS transistor 18 is coupled to the gate terminal of NMOS transistors 12 and 13, and the source terminal of NMOS transistor 18 is coupled to negative voltage rail 156.

Furthermore, third current source 103 is coupled between positive voltage rail 154 and the junction of the drain terminal of PMOS transistor 14, the drain terminal of PMOS transistor 15, and the drain terminal of NMOS transistor 18.

Figure 2B:
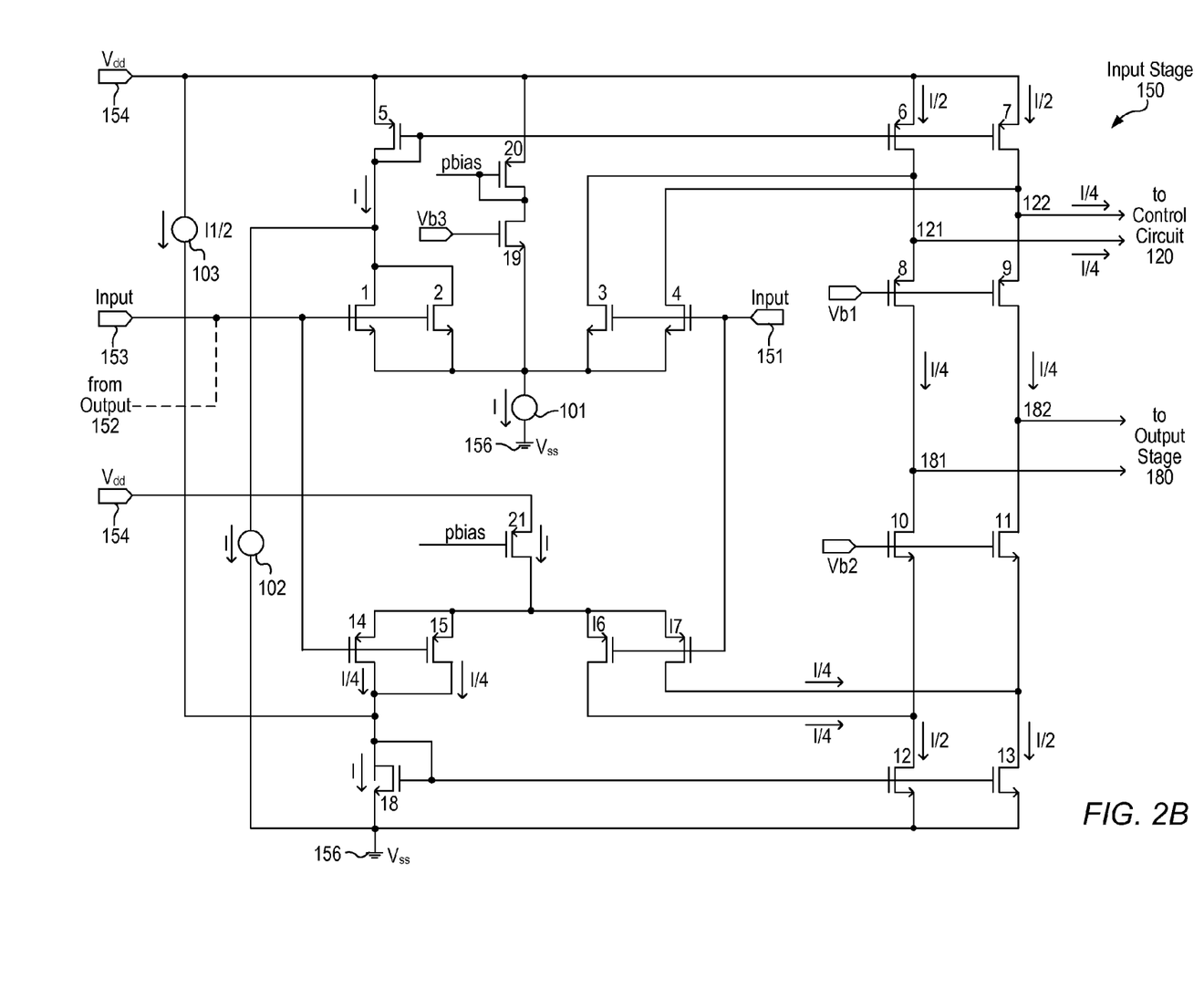
FIG. 2B is a circuit diagram of one embodiment of an input stage of the operational amplifier of FIG. 1.

During operation, when input terminal 151 is at negative voltage rail 156, the second differential input circuit is activated and the first differential input circuit is deactivated. As will be described further below, in response to activating the second differential input circuit, the first current mirror provides a current of the predetermined value to each of the first and second input terminals (121, 122) of control circuit 120, and to each of the first and second nodes (181, 182) coupled to the output stage 180.

As illustrated in the embodiment of FIG. 2B, when input terminal 151 is at negative voltage rail 156 and the second differential input circuit is activated, the second current source 102 provides a current I to the first current mirror. In response to receiving the current I, the first current mirror provides a current I/4 to each of the first and second input terminals (121, 122) of control circuit 120 and a current I/4 to each of the first and second nodes (181, 182) coupled to the output stage 180.

More specifically, as shown in FIG. 2B, in response to receiving the current I, the first current mirror produces a current I/2 through each of PMOS transistors 6 and 7 of the first current mirror. PMOS transistor 6 provides a current I/4 to the first input terminal 121 of control circuit 120, and a current I/4 to the first node 181 coupled to output stage 180. PMOS transistor 7 provides a current I/4 to the second input terminal 122 of control circuit 120, and a current I/4 to the second node 182 coupled to output stage 180. As previously noted above, in other embodiments, the current values may vary since the current produced through each of PMOS transistors 6 and 7 is dependent on the ratios associated with the first current mirror and the current provided by the current sources, for example.

In one embodiment, when the circuit is balanced, in response to activating the second differential input circuit, the first current mirror provides the same current that was provided when the input terminal 151 was at positive voltage rail 154 to each of the first and second input terminals (121, 122) of control circuit 120, and to each of the first and second nodes (181, 182) coupled to the output stage 180.

In other words, input stage 150 maintains the current provided to each of the first and second input terminals (121, 122) of control circuit 120 and to each of the first and second nodes (181, 182) coupled to rail-to-rail output stage 180 constant over the full input voltage range from negative voltage rail 156 to positive voltage rail 154. For example, the current may be kept constant at I/4. It is noted that, due to inherent variations in circuit components, keeping a current constant at a certain current value may be defined to mean keeping the current approximately constant at the current value. For instance, in some embodiments, keeping a current constant at I/4 may be defined as keeping the current within a certain current amount of I/4, e.g., 10 mA. In other embodiments, keeping a current constant at I/4 may be defined as keeping the current within a certain percentage of the current value, e.g., within two percent (2%) of I/4.

In one embodiment, when input terminal 151 is at positive voltage rail 154 and the first differential input circuit is activated (see FIG. 2A), third current source 103 provides a current I/2 to the second current mirror. In response to receiving the current I/2, the second current mirror produces a current I/4 through each of NMOS transistors 12 and 13 of the second current mirror.

As illustrated in FIGS. 2A and 2B, input stage 150 of operational amplifier 100 further includes an NMOS transistor 19 and a third current mirror. The third current mirror includes a PMOS transistor 20 and a PMOS transistor 21. In one specific implementation, the first current source 101 is coupled to the source terminal of NMOS transistors 1-4 and 19, and the drain terminal of NMOS transistor 19 is coupled to the drain terminal of PMOS transistor 20. Furthermore, the gate terminal of PMOS transistor 20 is coupled to the drain terminal of PMOS transistor 20 and to the gate terminal of PMOS transistor 21, the source terminal of PMOS transistors 20 and 21 are coupled to positive voltage rail 154, and the drain terminal of PMOS transistor 21 is coupled to the source terminal of PMOS transistors 14-17. It is noted that, even though not shown in FIGS. 2A and 2B, the gate terminals of PMOS transistors 20 and 21 are connected together by the line labeled "pbias" to form a current mirror configuration.

In one specific implementation, as illustrated in FIG. 2B, when input terminal 151 is at negative voltage rail 156 and the second differential input circuit is activated and the first differential input circuit is deactivated, NMOS transistor 19 is activated. In one embodiment, the gate terminal of NMOS transistor 19 may receive bias voltages Vb3. In this case, the first current source 101 provides a current I through NMOS transistor 19 to the third current mirror. The third current mirror produces a current I through PMOS transistor 21, and PMOS transistor 21 provides the current I to the second differential input circuit. In response to the second differential input circuit receiving the current I, each of PMOS transistors 14 and 15 provides a current I/4 to the second current mirror. Also, the third current source 103 provides a current I/2 to the second current mirror. Therefore, the second current mirror receives a total current of I. In response to receiving the total current I, the second current mirror produces a current I/2 through each of NMOS transistors 12 and 13 of the second current mirror. As noted above, in other embodiments, the current values may vary since the current produced through each of NMOS transistors 12 and 13 is dependent on the ratios associated with the second current mirror and the current provided by the current sources, for example.

It should be further noted that the components described with reference to FIGS. 2A and 2B are meant to be exemplary only, and are not intended to limit the invention to any specific set of components or configurations. For example, in various embodiments, one or more of the components described may be omitted, combined, modified, or additional components included, as desired. For instance, in some embodiments, the transistors in various parts of the circuitry may either be PMOS or NMOS transistors (or a variety of other types of transistors) depending on the particular design of input stage 150.

Furthermore, in other embodiments, operational amplifier 100 may not include the feedback path (shown as a dashed line in FIGS. 1-3) connecting output terminal 152 to the first and second differential input circuits of input stage 150. In these embodiments, instead of receiving inputs from input terminal 151 and the feedback path, input stage 150 of operational amplifier 100 may receive inputs directly from input terminal 151 and input terminal 153.

Figure 3:
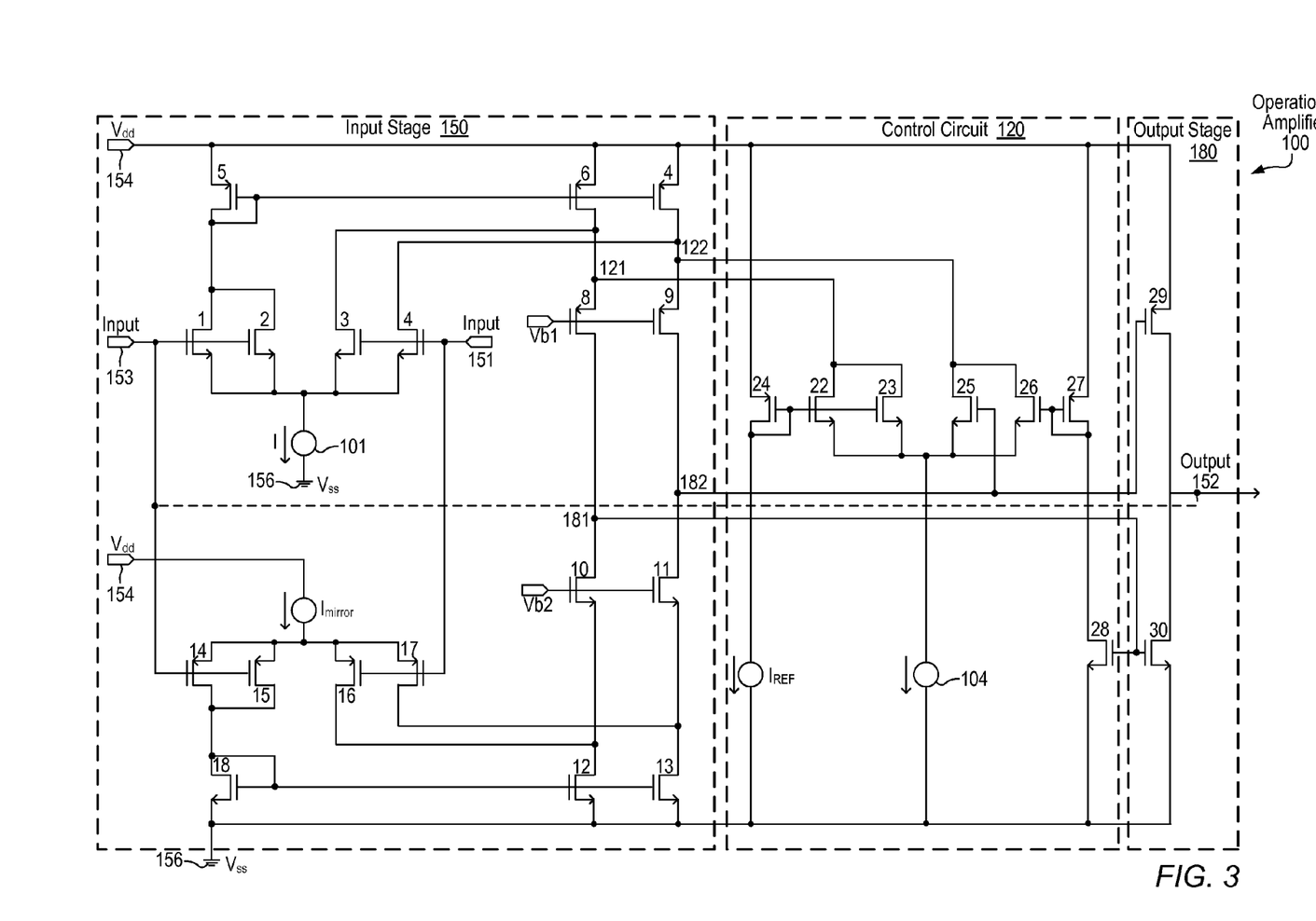
FIG. 3 is a circuit diagram of one embodiment of the operational amplifier of FIG. 1.

FIG. 3 is a circuit diagram of one embodiment of operational amplifier 100 shown in FIG. 1. As described above, operational amplifier 100 includes input stage 150, rail-to-rail output stage 180, and control circuit 120. It is noted that in the illustrated embodiment of FIG. 3, the current source $I_{mirror}$, which is connected to the second differential input circuit, is representative of NMOS transistor 19 and the third current mirror that are described above and illustrated in FIGS. 2A and 2B.

As illustrated in FIG. 3, in one specific implementation, control circuit 120 includes a fourth current source 104, a reference current source $I_{REF}$, NMOS transistors 22, 23, 25, 26, and 28, and PMOS transistors 24 and 27. Specifically, the drain terminal of NMOS transistors 22 and 23 are coupled to the first input terminal 121 of control circuit 120, the drain terminal of NMOS transistors 25 and 26 are coupled to the second input terminal 122 of control circuit 120, and the source terminal of NMOS transistors 22, 23, 25 and 26 are coupled to the fourth current source 104. The gate terminal of NMOS transistors 22 and 23 are coupled to the gate terminal of PMOS transistor 24, and the drain terminal of PMOS transistor 24 is coupled to reference current source $I_{REF}$ and to the gate terminal of PMOS transistor 24. In addition, the gate terminal of NMOS transistor 26 is coupled to the gate terminal of PMOS transistor 27, the drain terminal of PMOS transistor 27 is coupled to the drain terminal of NMOS transistor 28 and to the gate terminal of PMOS transistor 27, and the gate terminal of NMOS transistor 28 is coupled to the first node 181 coupled to output stage 180. Furthermore, the gate terminal of NMOS transistor 25 is coupled to the second node 182 coupled to output stage 180, the source terminal of PMOS transistors 24 and 27 are coupled to positive voltage rail 154, and negative voltage rail 156 is coupled to the fourth current source 104, the reference current source $I_{REF}$, and the source terminal of NMOS transistor 28.

Output stage 180 is connected to both input stage 150 and control circuit 120. In one specific implementation, output stage 180 includes a PMOS transistor 29 and an NMOS transistor 30. In this implementation, the gate terminal of PMOS transistor 29 is coupled to the second node 182 and to the gate terminal of NMOS transistor 25, and the gate terminal of NMOS transistor 30 is coupled to the first node 181 and to the gate terminal of NMOS transistor 28. Furthermore, the drain terminal of PMOS transistor 29 and NMOS transistor 30 are coupled to output terminal 152 of operational amplifier 100, the source terminal of PMOS transistor 29 is coupled to positive voltage rail 154, and the source terminal of NMOS transistor 30 is coupled to negative voltage rail 156.

One problem with a typical class AB output stage of an operational amplifier is that when one of the devices in the output stage is sourcing or sinking current, the other device turns off, which increases distortion in the circuit. In the embodiment of FIG. 3, to reduce distortion in the circuit, control circuit 120 controls the quiescent current through output stage 180 and makes sure that there is some minimum current flowing through output stage 180. Also, control circuit 120 has a relatively simple design, is accurate, and does not introduce any poles or zeroes to the circuitry, which helps improve the stability of the circuitry.

Control circuit 120 includes a third differential input circuit of NMOS transistors 22, 23, 25, and 26. Control circuit also includes a voltage summation circuit, which measures the gate voltages (i.e., nodes 181 and 182) of PMOS transistor 29 and NMOS transistor 30, and thus their currents. As illustrated in FIG. 3, the gate voltage of PMOS transistor 29 is directly measured, and the gate voltage of NMOS transistor 30 is indirectly measured through NMOS transistor 28 and PMOS transistor 27. The result from this operation is then compared with the reference current source $I_{REF}$ through PMOS transistor 24. Under quiescent conditions, PMOS transistor 29 and NMOS transistor 30 carry the same current and the gate voltages of PMOS transistor 29 and PMOS transistor 27 are the same. The third differential input circuit of NMOS transistors 22, 23, 25, and 26 forces the gate voltage of PMOS transistor 29 indirectly through PMOS transistor 27 and NMOS transistor 28 to be equal to the gate voltage of PMOS transistor 24. This implies that the quiescent current through output stage 180 is related to the current value associated with reference current source $I_{REF}$, which may prevent the current through output stage 180 from going to zero.

Input stage 150 is designed to interface with control circuit 120 to keep the first and second nodes (181, 182) of output stage 180 within their common mode range. Specifically, as described above with reference to FIGS. 2A and 2B, the current switching in input stage 150 is designed in such a way to keep the current through the first and second nodes (181, 182) of output stage 180 constant, irrespective of the common input voltage. This helps in keeping the common mode voltage of nodes 181 and 182 within the proper operating range and simultaneously preventing the current through output stage 180 from going to zero.

Furthermore, in some embodiments including the feedback path from output terminal 152 to input terminal 153, input stage 150 may be designed such that when input terminal 151 is trying to go towards positive voltage rail 154, the first and second nodes (181, 182) of output stage 180 will go low, hence enabling PMOS transistor 29 of output stage 180 to deliver current that is required by the load and pull the output node 152 high. If input terminal 151 is trying to go to negative voltage rail 156, the first and second nodes (181, 182) of output stage 180 will go high, hence enabling NMOS transistor 30 in output stage 180 to sink current while driving the output node 152 low.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. For instance, in some embodiments, the transistors in various parts of the circuitry may either be PMOS or NMOS transistors (or a variety of other types of transistors) depending on the particular design of operational amplifier 100.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An operational amplifier comprising:
   an input terminal;
   an input stage coupled to the input terminal of the operational amplifier, wherein the input stage is configured to couple to a control circuit and to a rail-to-rail output stage of the operational amplifier, wherein the input stage includes:
   a first differential input circuit coupled to the input terminal;
   a first current mirror coupled to the first differential input circuit;
   a second differential input circuit coupled to the input terminal;
   wherein, when the input terminal is at one of a positive voltage rail or a negative voltage rail of the operational amplifier, one of the first or second differential input circuits is activated and the other differential input circuit is deactivated;
   wherein, in response to activating one of the first or second differential input circuits, the first current mirror is configured to provide a current of a predetermined value to input terminals of the control circuit, and to nodes coupled to the rail-to-rail output stage of the operational amplifier;
   wherein the input stage is configured to maintain the current provided to the input terminals of the control circuit and to the nodes coupled to the rail-to-rail output stage constant over the full input voltage range from the negative voltage rail to the positive voltage rail.

2. The operational amplifier of claim 1,
wherein, in response to activating one of the first or second differential input circuits, the first current mirror is configured to provide a current of a predetermined value to each of a first input terminal and a second input terminal of the control circuit, and to each of a first node and a second node coupled to the output stage of the operational amplifier; and
wherein the input stage is configured to maintain the current provided to each of the first and second input terminals of the control circuit and to each of the first and second nodes coupled to the output stage constant over the full input voltage range from the negative voltage rail to the positive voltage rail.

3. The operational amplifier of claim 2, farther comprising an output terminal of the operational amplifier, wherein the first differential input circuit includes a first transistor, a second transistor, a third transistor, and a fourth transistor, wherein the gate terminal of the first and second transistors are coupled to the output terminal of the operational amplifier, the drain terminal of the first transistor is coupled to the drain terminal of the second transistor, the source terminal of the first transistor is coupled to the source terminal of the second, third, and fourth transistors, and the gate terminal of the third and fourth transistors are coupled to the input terminal of the operational amplifier.

4. The operational amplifier of claim 3, wherein the first current mirror includes a fifth transistor, a sixth transistor, and a seventh transistor, wherein the drain terminal of the fifth transistor is coupled to the gate terminal of the fifth transistor and to the drain terminal of the first and second transistors, the gate terminal of the fifth transistor is coupled to the gate terminal of the sixth and seventh transistors, the source terminal of the fifth, sixth, and seventh transistors are coupled to the positive voltage rail of the operational amplifier, the drain terminal of the sixth transistor is coupled to the drain terminal of the third transistor and to a first input terminal of the control circuit of the operational amplifier, and the drain terminal of the seventh transistor is coupled to the drain terminal of the fourth transistor and to a second input terminal of the control circuit.

5. The operational amplifier of claim 4, further comprising a first current source and a second current source, wherein the first current source is coupled between the negative voltage rail of the operational amplifier and the source terminal of the first, second, third, and fourth transistors, and wherein the second current source is coupled between the negative voltage rail and the junction of the drain terminal of the first transistor, the drain terminal of the second transistor, and the drain terminal of the fifth transistor.

6. The operational amplifier of claim 5, wherein, when the input terminal is at the positive voltage rail of the operational amplifier and the first differential input circuit is activated, the first current source is configured to provide a current I to the first differential input circuit, wherein in response to receiving the current I the first and second transistors are each configured to provide a current I/4 to the first current mirror, wherein the second current source is configured to provide a current I to the first current mirror, wherein in response to receiving a total current 3I/2 the first current mirror is configured to provide a current I/4 to each of the first and second input terminals of the control circuit and a current I/4 to each of the first and second nodes coupled to the output stage of the operational amplifier.

7. The operational amplifier of claim 6, wherein the input stage is configured to maintain the current I/4 provided to each of the first and second input terminals of the control circuit and the current I/4 provided to each of the first and second nodes coupled to the output stage constant over the full input voltage range from the negative voltage rail to the positive voltage rail.

8. The operational amplifier of claim 6, wherein, in response to receiving the current 3I/2, the first current mirror is configured to produce a current 3I/4 through each of the sixth and seventh transistors of the first current mirror, wherein the sixth transistor is configured to provide a current I/4 to the third transistor of the first differential input circuit, a current I/4 to the first input terminal of the control circuit, and a current I/4 to the first node coupled to the output stage of the operational amplifier, and wherein the seventh transistor is configured to provide a current I/4 to the fourth transistor of the first differential input circuit, a current I/4 to the second input terminal of the control circuit, and a current I/4 to the second node coupled to the output stage of the operational amplifier.

9. The operational amplifier of claim 5, wherein, when the input terminal is at the negative voltage rail of the operational amplifier and the second differential input circuit is activated, the second current source is configured to provide a current I to the first current mirror, wherein in response to receiving the current I the first current mirror is configured to provide a current I/4 to each of the first and second input terminals of the control circuit and a current I/4 to each of the first and second nodes coupled to the output stage of the operational amplifier.

10. The operational amplifier of claim 9, wherein, in response to receiving the current I, the first current mirror is configured to produce a current I/2 through each of the sixth and seventh transistors of the first current mirror, wherein the sixth transistor is configured to provide a current I/4 to the first input terminal of the control circuit and a current I/4 to the first node coupled to the output stage of the operational amplifier, and wherein the seventh transistor is configured to provide a current I/4 to the second input terminal of the control circuit and a current I/4 to the second node coupled to the output stage of the operational amplifier.

11. The operational amplifier of claim 1, wherein the input terminal is a first input terminal of the operational amplifier, and the operational amplifier farther comprises a second input terminal coupled to the input stage, wherein the first differential input circuit includes a first transistor, a second transistor, a third transistor, and a fourth transistor, wherein the gate terminal of the first and second transistors are coupled to the second input terminal of the operational amplifier, the drain terminal of the first transistor is coupled to the drain terminal of the second transistor, the source terminal of the first transistor is coupled to the source terminal of the second, third, and fourth transistors, and the gate terminal of the third and fourth transistors are coupled to the first input terminal of the operational amplifier.

12. The operational amplifier of claim 5, further comprising:
a folded cascode circuit coupled to the first current mirror, wherein the folded cascode circuit includes the sixth transistor, the seventh transistors, an eight transistor, a ninth transistor, a tenth transistor, an eleventh transistor, a twelfth transistor, and a thirteenth transistor, wherein the source terminal of the eight transistor is coupled to the drain terminal of the sixth transistor, the source terminal of the ninth transistor is coupled to the drain terminal of the seventh transistor, the drain terminal of the eighth transistor is coupled to the first node coupled to the output stage of the operational amplifier and to the drain terminal of the tenth transistor, the drain terminal of the ninth transistor is coupled to the second node coupled to the output stage and to the drain terminal of the eleventh transistor, the source terminal of the tenth transistor is coupled to the drain terminal of the twelfth transistor, the source terminal of the eleventh transistor is coupled to the drain terminal of the thirteenth transistor, and the source terminal of the twelfth and thirteenth transistors are coupled to the negative voltage rail of the operational amplifier;

a second differential input circuit coupled to the input terminal of the operational amplifier, wherein the second differential input circuit includes a fourteenth transistor, a fifteenth transistor, a sixteenth transistor, and a seventeenth transistor, wherein the gate terminal of the fourteenth and fifteenth transistors are coupled to the output terminal of the operational amplifier, the drain terminal of the fourteenth transistor is coupled to the drain terminal of the fifteenth transistor, the source terminal of the fourteenth transistor is coupled to the source terminal of the fifteenth, sixteenth, and seventeenth transistors, the gate terminal of the sixteenth and seventeenth transistors are coupled to the input terminal of the operational amplifier, the drain terminal of the sixteenth transistor is coupled to the drain terminal of the twelfth transistor and to the source terminal of the tenth transistor, and the drain terminal of the seventeenth transistor is coupled to the drain terminal of the thirteenth transistor and to the source terminal of the eleventh transistor; and a second current mirror coupled to the second differential input circuit, wherein the second current mirror includes the twelfth transistor, the thirteenth transistor, and an eighteenth transistor, wherein the drain terminal of the eighteenth transistor is coupled to the gate terminal of the eighteenth transistor and to the drain terminal of the fourteenth and fifteenth transistors, the gate terminal of the eighteenth transistor is coupled to the gate terminal of the twelfth and thirteenth transistors, and the source terminal of the eighteenth transistor is coupled to the negative voltage rail of the operational amplifier.

13. The operational amplifier of claim 12, further comprising a third current source coupled between the positive voltage rail and the junction of the drain terminal of the fourteenth transistor, the drain terminal of the fifteenth transistor, and the drain terminal of the eighteenth transistor.

14. The operational amplifier of claim 13, wherein, when the input terminal is at the positive voltage rail of the operational amplifier and the first differential input circuit is activated, the third current source is configured to provide a current I/2 to the second current mirror, wherein in response to receiving the current I/2 the second current mirror is configured to produce a current I/4 through each of the twelfth and thirteenth transistors of the second current mirror.

15. The operational amplifier of claim 13, wherein the input stage of the operational amplifier further includes a nineteenth transistor and a third current mirror, wherein the third current mirror includes a twentieth transistor and a twenty-first transistor, wherein the first current source is coupled to the source terminal of the first, second, third, fourth, and nineteenth transistors, the drain terminal of the nineteenth transistor is coupled to the drain terminal of the twentieth transistor, the gate terminal of the twentieth transistor is coupled to the drain terminal of the twentieth transistor and to the gate terminal of the twenty-first transistor, the source terminal of the twentieth and twenty-first transistors are coupled to the positive voltage rail, and the drain terminal of the twenty-first transistor is coupled to the source terminal of the fourteenth, fifteenth, sixteenth, and seventeenth transistors.

16. The operational amplifier of claim 15, wherein, when the input terminal is at the negative voltage rail of the operational amplifier and the second differential input circuit is activated and the first differential input circuit is deactivated, the nineteenth transistor is activated and the first current source provides a current I through the nineteenth transistor to the third current mirror, wherein the third current mirror is configured to produce a current I through the twenty-first transistor, wherein the twenty-first transistor is configured to provide the current I to the second differential input circuit, wherein in response to the second differential input circuit receiving the current I the fourteenth and fifteenth transistors are each configured to provide a current I/4 to the second current mirror, wherein the third current source is configured to provide a current I/2 to the second current mirror, wherein in response to receiving a total current I the second current mirror is configured to produce a current I/2 through each of the twelfth and thirteenth transistors of the second current mirror.

17. An operational amplifier comprising:
an input terminal;
an input stage coupled to the input terminal of the operational amplifier, wherein the input stage is configured to couple to a control circuit and to a rail-to-rail output stage of the operational amplifier, wherein the input stage includes:
a first differential input circuit coupled to the input terminal;
a first current mirror coupled to the first differential input circuit;
a second differential input circuit coupled to the input terminal;
wherein, when the input terminal is at a positive voltage rail of the operational amplifier, the first differential input circuit is activated and the second differential input circuit is deactivated;
wherein, in response to activating the first differential input circuit, the first current mirror is configured to provide a current of a predetermined value to each of a first input terminal and a second input terminal of the control circuit, and to each of a first node and a second node coupled to the rail-to-rail output stage of the operational amplifier;
wherein, when the input terminal is at a negative voltage rail of the operational amplifier, the second differential input circuit is activated and the first differential input circuit is deactivated;
wherein, in response to activating the second differential input circuit, the first current mirror is configured to provide a current of the predetermined value to each of the first and second input terminals of the control circuit, and to each of the first and second nodes coupled to the rail-to-rail output stage of the operational amplifier;
wherein the input stage is configured to maintain the current provided to each of the first and second input terminals of the control circuit and to each of the first and second nodes coupled to the rail-to-rail output stage constant over the full input voltage range from the negative voltage rail to the positive voltage rail.

18. An operational amplifier comprising:
a first input terminal;
a second input terminal;

an input stage coupled to the first and second input terminals of the operational amplifier, wherein the input stage is configured to couple to a control circuit and a rail-to-rail output stage of the operational amplifier, wherein the input stage includes:
a first differential input circuit coupled to the first and second input terminals of the operational amplifier, wherein the first differential input circuit includes a first transistor, a second transistor, a third transistor, and a fourth transistor, wherein the gate terminal of the first and second transistors are coupled to the second input terminal of the operational amplifier, the drain terminal of the first transistor is coupled to the drain terminal of the second transistor, the source terminal of the first transistor is coupled to the source terminal of the second, third, and fourth transistors, and the gate terminal of the third and fourth transistors are coupled to the first input terminal of the operational amplifier;
a first current mirror coupled to the first differential input circuit, wherein the first current mirror includes a fifth transistor, a sixth transistor, and a seventh transistor, wherein the drain terminal of the fifth transistor is coupled to the gate terminal of the fifth transistor and to the drain terminal of the first and second transistors, the gate terminal of the fifth transistor is coupled to the gate terminal of the sixth and seventh transistors, the source terminal of the fifth, sixth, and seventh transistors are coupled to a positive voltage rail of the operational amplifier, the drain terminal of the sixth transistor is coupled to the drain terminal of the third transistor and to a first input terminal of the control circuit of the operational amplifier, and the drain terminal of the seventh transistor is coupled to the drain terminal of the fourth transistor and to a second input terminal of the control circuit; and
a folded cascode circuit coupled to the first current mirror, wherein the folded cascode circuit includes the sixth transistor, the seventh transistors, an eight transistor, a ninth transistor, a tenth transistor, an eleventh transistor, a twelfth transistor, and a thirteenth transistor, wherein the source terminal of the eight transistor is coupled to the drain terminal of the sixth transistor, the source terminal of the ninth transistor is coupled to the drain terminal of the seventh transistor, the drain terminal of the eighth transistor is coupled to a first input terminal of the rail-to-rail output stage of the operational amplifier and to the drain terminal of the tenth transistor, the drain terminal of the ninth transistor is coupled to a second input terminal of the rail-to-rail output stage and to the drain terminal of the eleventh transistor, the source terminal of the tenth transistor is coupled to the drain terminal of the twelfth transistor, the source terminal of the eleventh transistor is coupled to the drain terminal of the thirteenth transistor, and the source terminal of the twelfth and thirteenth transistors are coupled to a negative voltage rail of the operational amplifier.

19. The operational amplifier of claim 18, wherein the input stage further includes:
a second differential input circuit coupled to the first and second input terminals of the operational amplifier, wherein the second differential input circuit includes a fourteenth transistor, a fifteenth transistor, a sixteenth transistor, and a seventeenth transistor, wherein the gate terminal of the fourteenth and fifteenth transistors are coupled to the second input terminal of the operational amplifier, the drain terminal of the fourteenth transistor is coupled to the drain terminal of the fifteenth transistor, the source terminal of the fourteenth transistor is coupled to the source terminal of the fifteenth, sixteenth, and seventeenth transistors, the gate terminal of the sixteenth and seventeenth transistors are coupled to the first input terminal of the operational amplifier, the drain terminal of the sixteenth transistor is coupled to the drain terminal of the twelfth transistor and to the source terminal of the tenth transistor, and the drain terminal of the seventeenth transistor is coupled to the drain terminal of the thirteenth transistor and to the source terminal of the eleventh transistor; and
a second current mirror coupled to the second differential input circuit, wherein the second current mirror includes the twelfth transistor, the thirteenth transistor, and an eighteenth transistor, wherein the drain terminal of the eighteenth transistor is coupled to the gate terminal of the eighteenth transistor and to the drain terminal of the fourteenth and fifteenth transistors, the gate terminal of the eighteenth transistor is coupled to the gate terminal of the twelfth and thirteenth transistors, and the source terminal of the eighteenth transistor is coupled to the negative voltage rail of the operational amplifier.

20. The operational amplifier of claim 19, further comprising an output terminal, and a feedback path coupled between the output terminal and the second input terminal of the operational amplifier, wherein the output terminal of the operational amplifier is coupled to the gate terminal of the first and second transistors and to the gate terminal of the fourteenth and fifteenth transistors via the feedback path.

21. The operational amplifier of claim 19, wherein the input stage of the operational amplifier further includes a first current source, a nineteenth transistor, and a third current mirror, wherein the third current mirror includes a twentieth transistor and a twenty-first transistor, wherein the first current source is coupled between the negative voltage rail of the operational amplifier and the source terminal of the first, second, third, fourth, and nineteenth transistors, the drain terminal of the nineteenth transistor is coupled to the drain terminal of the twentieth transistor, the gate terminal of the twentieth transistor is coupled to the drain terminal of the twentieth transistor and to the gate terminal of the twenty-first transistor, the source terminal of the twentieth and twenty-first transistors are coupled to the positive voltage rail, and the drain terminal of the twenty-first transistor is coupled to the source terminal of the fourteenth, fifteenth, sixteenth, and seventeenth transistors.

22. The operational amplifier of claim 19, further comprising the control circuit coupled to the input stage, wherein the control circuit comprises a fourth current source, a reference current source, a twenty-second transistor, a twenty-third transistor, a twenty-fourth transistor, a twenty-fifth transistor, a twenty-sixth transistor, a twenty- seventh transistor, and a twenty-eighth transistor, wherein the drain terminal of the twenty-second and twenty-third transistors are coupled to the first input terminal of the control circuit, the drain terminal of the twenty-fifth and twenty-sixth transistors are coupled to the second input terminal of the control circuit, the source terminal of the twenty-second, twenty-third, twenty-fifth, and twenty-sixth transistors are coupled to the fourth current source, the gate terminal of the twenty-second and twenty-third transistors are coupled to the gate terminal of the twenty-fourth transistor, the drain terminal of the twenty-fourth transistor is coupled to the reference current source and to the gate terminal of the twenty-fourth transistor, the gate terminal of the twenty-sixth transistor is coupled to the gate terminal of the twenty-seventh transistor, the drain terminal of the twenty-seventh transistor is coupled to the drain terminal of the twenty-eight transistor and to the gate terminal of the twenty-seventh transistor, the gate terminal of the twenty-eight transistor is coupled to the first node coupled to the output stage of the operational amplifier, the gate terminal of the twenty-fifth transistor is coupled to the second node coupled to the output stage, the source terminal of the twenty-fourth and twenty-seventh transistors are coupled to the positive voltage rail, and the negative voltage rail is coupled to the fourth current source, the reference current source, and the source terminal of the twenty-eight transistor.

23. The operational amplifier of claim 22, further comprising the output stage coupled to the input stage and to the control circuit, wherein the output stage comprises a twenty-ninth transistor and a thirtieth transistor, wherein the gate terminal of the twenty- ninth transistor is coupled to the second node and to the gate terminal of the twenty-fifth transistor, the gate terminal of the thirtieth transistor is coupled to the first node and to the gate terminal of the twenty-eight transistor, the drain terminal of the twenty-ninth and thirtieth transistors are coupled to an output terminal of the operational amplifier, the source terminal of the twenty-ninth transistor is coupled to the positive voltage rail, and the source terminal of the thirtieth transistor is coupled to the negative voltage rail.

* * * * *